United States Patent
Lee

(10) Patent No.: US 7,808,829 B2
(45) Date of Patent: Oct. 5, 2010

(54) FLASH MEMORY DEVICE CAPABLE OF OVERCOMING FAST PROGRAM/SLOW ERASE PHENOMENON AND ERASE METHOD THEREOF

(75) Inventor: Hee Youl Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 174 days.

(21) Appl. No.: 11/765,531

(22) Filed: Jun. 20, 2007

(65) Prior Publication Data

US 2008/0239828 A1    Oct. 2, 2008

(30) Foreign Application Priority Data

Mar. 27, 2007    (KR) .................. 10-2007-0029616

(51) Int. Cl.
  *G11C 16/16*    (2006.01)
(52) U.S. Cl. .................... 365/185.19; 365/185.33; 365/185.29; 365/185.27; 365/185.18; 365/185.11; 365/185.22; 365/185.24
(58) Field of Classification Search ............. 365/185.11, 365/185.3, 185.33, 185.29, 185.19, 185.18, 365/185.27, 185.24, 185.22, 185.17
See application file for complete search history.

(56) References Cited

U.S. PATENT DOCUMENTS

| | | | | |
|---|---|---|---|---|
| 5,680,350 A | * | 10/1997 | Lee | 365/185.24 |
| 5,933,847 A | * | 8/1999 | Ogawa | 711/103 |
| 6,243,292 B1 | * | 6/2001 | Kobayashi et al. | 365/185.13 |
| 6,515,908 B2 | * | 2/2003 | Miyawaki et al. | 365/185.22 |
| 6,781,882 B2 | | 8/2004 | Shimizu et al. | |
| 7,319,615 B1 | | 1/2008 | Park et al. | |
| 2006/0279999 A1 | | 12/2006 | Byeon et al. | |
| 2007/0159893 A1 | | 7/2007 | Fan et al. | |

FOREIGN PATENT DOCUMENTS

| | | |
|---|---|---|
| JP | 05-234385 | 9/1993 |
| JP | 2004-171686 | 6/2004 |
| KR | 1020040008532 A | 1/2004 |
| KR | 1020070023180 A | 2/2007 |
| KR | 100744014 B1 | 7/2007 |

* cited by examiner

*Primary Examiner*—Andrew Q Tran
(74) *Attorney, Agent, or Firm*—Townsend and Townsend and Crew LLP

(57) ABSTRACT

An erase operating time can be shortened and an erase operating characteristic can be improved in a flash memory device. The flash memory device includes a plurality of memory cell blocks, an operating voltage generator and a controller. Each of the plurality of memory cell blocks includes memory cells connected to a plurality of word lines. A voltage generator is configured to apply an erase voltage to a memory cell block selected for an erase operation, and change a level of the erase voltage if an attempt of the erase operation is not successful. A controller is configured to control the voltage generator to apply a first erase voltage to a memory cell block selected for an erase operation. The first erase voltage corresponds to a previous erase voltage that was used successfully in completing a previous erase operation. The first erase voltage is an erase voltage that is used in a first erase attempt for the erase operation.

16 Claims, 3 Drawing Sheets

FLASH MEMORY DEVICE CAPABLE OF OVERCOMING FAST PROGRAM/SLOW ERASE PHENOMENON AND ERASE METHOD THEREOF

CROSS-REFERENCES TO RELATED APPLICATIONS

The present application claims priority to Korean patent application number 10-2007-029616, filed on Mar. 27, 2007, which is incorporated by reference in its entirety.

BACKGROUND OF THE INVENTION

The present invention relates to flash memory devices and, more particularly, to an erase method in which an erase operating time can be shortened and an erase operating characteristic can be improved.

Semiconductor memory devices include non-volatile memory devices whose data is not lost even if the supply of power is cut off. The non-volatile memory devices include the flash memory device. The flash memory device includes a NOR flash memory device and a NAND flash memory device. Of them, the NAND flash memory device includes a memory cell array with a plurality of memory cell blocks. An erase operation of the NAND flash memory device is performed on a memory-cell-block basis. In general, the erase operation of the NAND flash memory device is implemented by applying a voltage of 0 V to word lines connected to memory cells included in a selected block and applying a high voltage (e.g., 20 V) to the well region.

In the NAND flash memory device constructed above, an erase/writing (E/W) cycling characteristic must be guaranteed in order to prevent any problems from occurring (e.g., an electrical characteristic problem) even if write (program) and deletion (erase) operations are carried out repeatedly. If E/W cycling is repeated numerous times, electrons are trapped in the tunnel oxide layer, so that threshold voltages are influenced at the time of a program operation and an erase operation.

FIG. 1 is a graph illustrating the variation in threshold voltages with the number of repeated program operations and erase operations.

Referring to FIG. 1, as the number of the program operations and erase operations increases, a threshold voltage of a memory cell becomes higher than a target voltage. In other words, at the time of the program operation, the memory cell is programmed more rapidly than normal, so that the program operation is performed with the threshold voltage being higher than the target voltage (hereinafter, this will be referred to as a "fast program phenomena"). Further, at the time of the erase operation, the memory cell is discharged slower than normal, so that the erase operation is performed with the threshold voltage being higher than the target voltage (hereinafter, this will be referred to as a "slow erase phenomena").

Thus, in order to overcome the higher threshold voltages the erase operation is carried out in such a manner that an erase voltage applied to a well region is raised as high as the increased threshold voltage, at the time of the erase operation. However, as the size of a cell shrinks, the area of the tunnel oxide layer is decreased, thereby further weakening the E/W cycling characteristic.

FIG. 2 is a graph illustrating variation in a fast program phenomenon and a slow erase phenomenon depending on erase voltages.

From FIG. 2, it can be seen that as an erase voltage applied to the well region is raised at the time of the erase operation, the fast program phenomenon and the slow erase phenomenon become profound. In other words, as the erase voltage rises, the fast program phenomenon becomes profound, so that the threshold voltage after the program operation is even higher than a target voltage. Furthermore, at the time of the erase operation, the slow erase phenomenon also becomes profound, so that the threshold voltage after the erase operation is even higher than the target voltage. As described above, the fast program phenomenon or the slow erase phenomenon is sensitive to the level of the erase voltage. It makes it difficult to use a high erase voltage.

Accordingly, in order to prevent the phenomena, at the time of a first erase operation, the erase operation can be performed by gradually increasing the voltage difference between the control gate and the well region after starting with a low voltage difference. This erase operation includes an Incremental Stepping Pulse Erase (ISPE) method which increases the erase voltage applied to the well region from a low voltage to a high voltage, and a Decreasing Stepping Pulse Erase (DSPE) method which reduces the voltage applied to the control gate from a high voltage to a low voltage. The methods can improve the E/W cycling characteristic by incrementally increasing the voltage difference after starting with a low voltage difference between the control gate and the well region. However, these erase methods have the following problems.

First, since the erase operation is repeated several times while increasing the voltage difference between the control gate and the well region, an overall erase operating time increases.

Next, if the voltage difference between the control gate and the well region is increased so as to reduce the erase operating time, the E/W cycling characteristic will deteriorate.

SUMMARY OF THE INVENTION

Accordingly, the present invention relates to a flash memory device and an erase method thereof, in which an erase characteristic (E/W cycling characteristic) can be improved.

In an aspect, the present invention provides a flash memory device including a plurality of memory cell blocks, an operating voltage generator and a controller. Each of the plurality of memory cell blocks includes memory cells connected to a plurality of word lines. The operating voltage generator applies an erase operation voltage to a selected memory cell block at the time of an erase operation, and changes the level of the erase operating voltage according to the results of the erase operation. The controller controls the operating voltage generator so that an erase operation voltage having the same level as that of a last erase operation voltage, which is applied when the erase operation is normally completed, is applied as a first erase operation voltage in a new erase operation.

In another aspect, the present invention provides an erase method of a flash memory device, including the steps of performing an erase operation while changing a level of an erase operating voltage until all memory cells included in a memory cell block are erased, storing a data value corresponding to a level of an erase operating voltage, which is applied when the erase operation of the memory cell block is normally completed, and performing a new erase operation of a memory cell block by setting an erase operation voltage having a level corresponding to the data value as a first erase operation voltage when the new erase operation begins.

In still another aspect, the present invention provides an erase method of a flash memory device, including the steps of setting a level of an erase operating voltage to be applied when an erase operation begins, performing the erase operation while changing the level of the erase operating voltage until all memory cells of a memory cell block are normally erased, setting a level of a new erase operating voltage to be applied when a new erase operation of the memory cell block begins as the level of the erase operating voltage applied on last in the erase operation; and performing the new erase operation while changing the level of the erase operating voltage until all the memory cells of the memory cell block are normally erased.

DESCRIPTION OF SPECIFIC EMBODIMENTS

Specific embodiments according to the present patent will be described with reference to the accompanying drawings.

Figure 3:
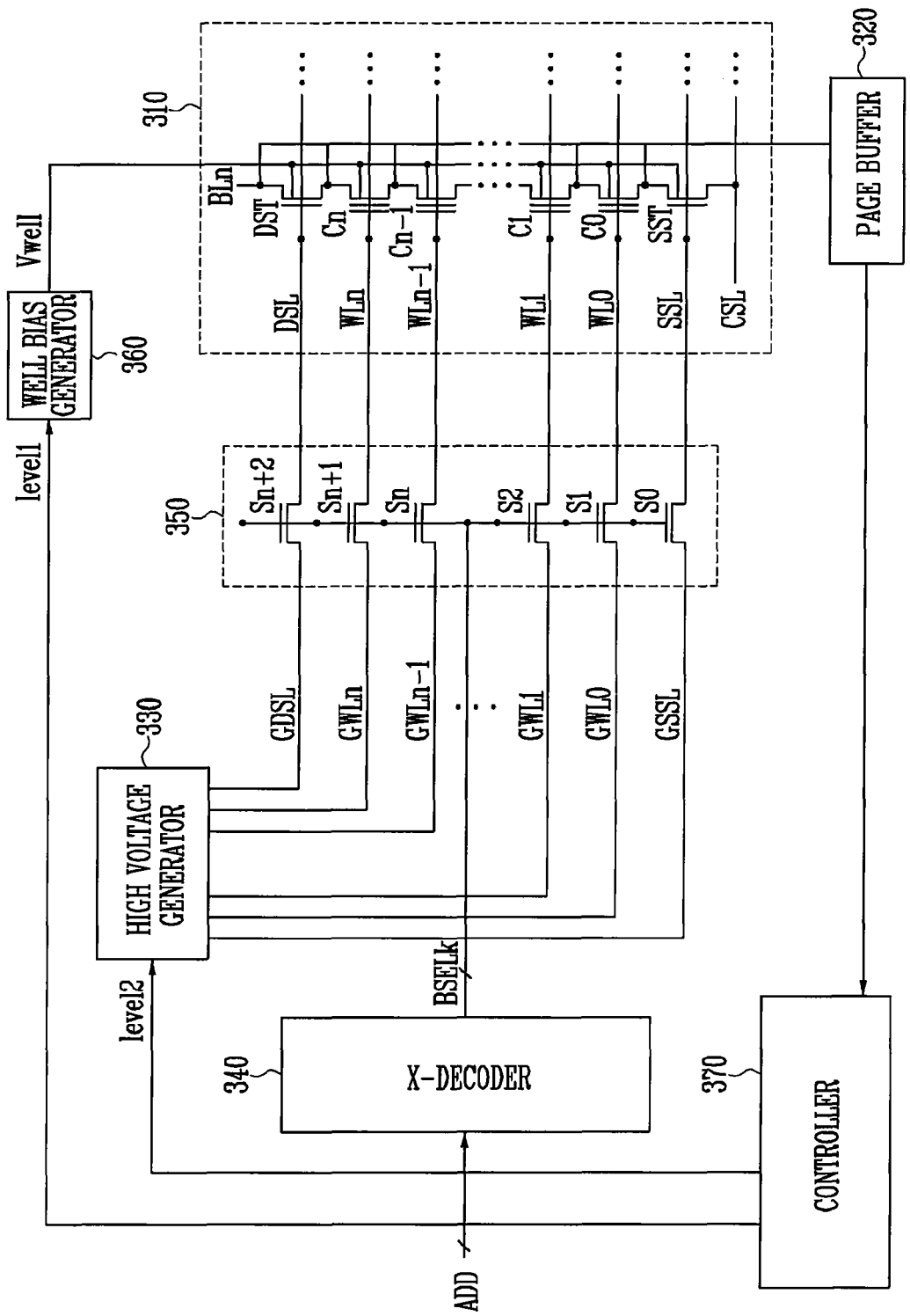
FIG. 3 is a circuit diagram of a flash memory device according to an embodiment of the present invention.

Referring to FIG. 3, the flash memory device according to an embodiment of the present invention includes a memory cell array 310, a page buffer 320, a high voltage generator 330, an X decoder 340, a switching unit 350, a well bias generator 360 and a controller 370.

The memory cell array 310 includes a plurality of memory cell blocks. Each of the memory cell blocks includes a plurality of cell strings (only one of the plurality of cell strings is illustrated for convenience). The cell string has a structure in which a drain select transistor DST, a plurality of memory cells C0 to Cn and a source select transistor SST are connected in series. The drain select transistor DST included in the cell string is connected to a corresponding bit line BLn, and the source select transistor SST is connected to a common source line CSL.

Meanwhile, the gates of the drain select transistors DST included in the respective cell strings are connected to a drain select line DSL, and the gates of the source select transistors SST included in the respective cell strings are connected to a source select line SSL. Furthermore, the gates of the memory cells C0 to Cn are connected to word lines WL0 to WLn, respectively, each of which becomes a page unit.

The bit lines BLn are connected to the page buffer 320 for reading data stored in the memory cells or transferring input data to the bit lines BLn.

The X decoder 340 outputs a block select signal BSELk to select one of the plurality of memory cell blocks in response to an address signal ADD.

The high voltage generator 330 outputs operating voltages (hereinafter, referred to as "erase operation voltages"), necessary for an erase operation, to a global drain select line GDSL, a plurality of global word lines GWL and a global source select line GSSL. The erase operation voltages may have varying levels. The high voltage generator 330 can also output operating voltages necessary for a program operation or a read operation, as well as the erase operation, to the global drain select line GDSL, the plurality of global word lines GWL and the global source select line GSSL, at different levels.

The well bias generator 360 applies voltage to a well region of the memory cell block at the time of the erase operation, the program operation and the read operation. In particular, the well bias generator 360 applies a well bias Vwell of a high voltage to the well region at the time of the erase operation. The high voltage generator 330 and the well bias generator 360 can be collectively referred to as an "operating voltage generator."

The switching unit 350 transfers the erase operation voltages generated from the high voltage generator 330, to the drain select line DSL, the plurality of word lines WL0 to WLn and the source select line SSL of a selected memory cell block in response to the block select signal BSELk of the X decoder 340. In other words, the switching unit 350 connects the drain select line DSL, the plurality of word lines WL0 to WLn and the source select line SSL of a selected block to the global drain select line GDSL, the plurality of global word lines GWL0 to GWLn and the global source select line GSSL, respectively, in response to the block select signal BSELk of the X decoder 340.

The switching unit 350 includes a switching element S0 connected between the global source select line GSSL and the source select line SSL, switching elements S1 to Sn+1 connected between the global word lines GWL0 to GWLn and the word lines WL0 to WLn, respectively, and a switching element Sn+2 connected between the global drain select line GDSL and the drain select line DSL. The switching elements are turned on in response to the block select signal BSELk of the X decoder 340.

The controller 370 stores a data value corresponding to a voltage difference applied to a control gate (hereinafter, referred to as a "word line") and the well region when an erase operation using the ISPE method, the DSPE method or a mixture of the two is normally finished. When a new erase operation is performed after an erase operation is completed in the above manner, the controller 370 outputs first and second control signals level1 and level2 in order to control the generation of a word line bias of the high voltage generator 330 or the well bias Vwell of the well bias generator 360 such that the erase operation is carried out with the previously stored voltage difference being set to a first voltage difference. In this case, the first and second control signals can become a data value corresponding to a voltage difference.

When starting a new erase operation, the well bias generator 360 outputs the first well bias Vwell with the same level as the final well bias Vwell in a previous operation according to the first control signal level1. Further, the high voltage generator 330 also outputs the word line bias having the same level as that of the final word line bias, which is applied in a previous operation according to the second control signal level2.

In the above, the controller 370 can store a voltage difference, which is representative of all blocks, or can separately store the voltage difference on a block basis. The controller 370 can store the voltage difference as follows.

First, the controller 370 can store the final well bias Vwell applied to the well region in the erase operation using the ISPE method. For example, the erase operation of the ISPE method can be carried out while increasing the well bias applied to the well region, and the erase verify operation can be performed by changing the well bias whenever the erase operation is carried out. If it is confirmed that the erase verify operation has been normally performed on all memory cells, the controller 370 stores a data value corresponding to the final level of a well bias applied to the well region. That is, the controller 370 stores the highest well bias Vwell applied to the well region in the erase operation using the ISPE method.

Second, the controller 370 can store a final word line bias applied to a word line in the erase operation using the DSPE method. For example, the erase operation using the DSPE method can be carried out while decreasing the word line bias applied to the word line, and the erase verify operation can be performed by changing the word line bias whenever the erase operation is carried out. If it is confirmed that the erase verify operation has been normally performed on all memory cells, the controller 370 stores a data value corresponding to the final level of a word line bias applied to the word line. In other words, the controller 370 stores the lowest word line bias applied to the word lines in the erase operation using the DSPE method.

Third, the controller 370 can store the word line bias and the final well bias Vwell applied to the word line and the well region in the erase operation that is performed by changing the word line bias and the well bias at the same time. For example, the erase operation can be performed while decreasing the word line bias, but increasing the well bias, and the erase verify operation can be carried out by changing the biases whenever the erase operation is performed. If it is confirmed that the erase verify operation has been normally performed on all memory cells, the controller 370 stores data values, corresponding to the levels of a final word line bias applied to the word line and a final well bias Vwell applied to the well region. In other words, the controller 370 stores data values of the level of the lowest word line bias applied to the word line and the level of the highest well bias Vwell applied to the well region in the erase operation.

Figure 4:
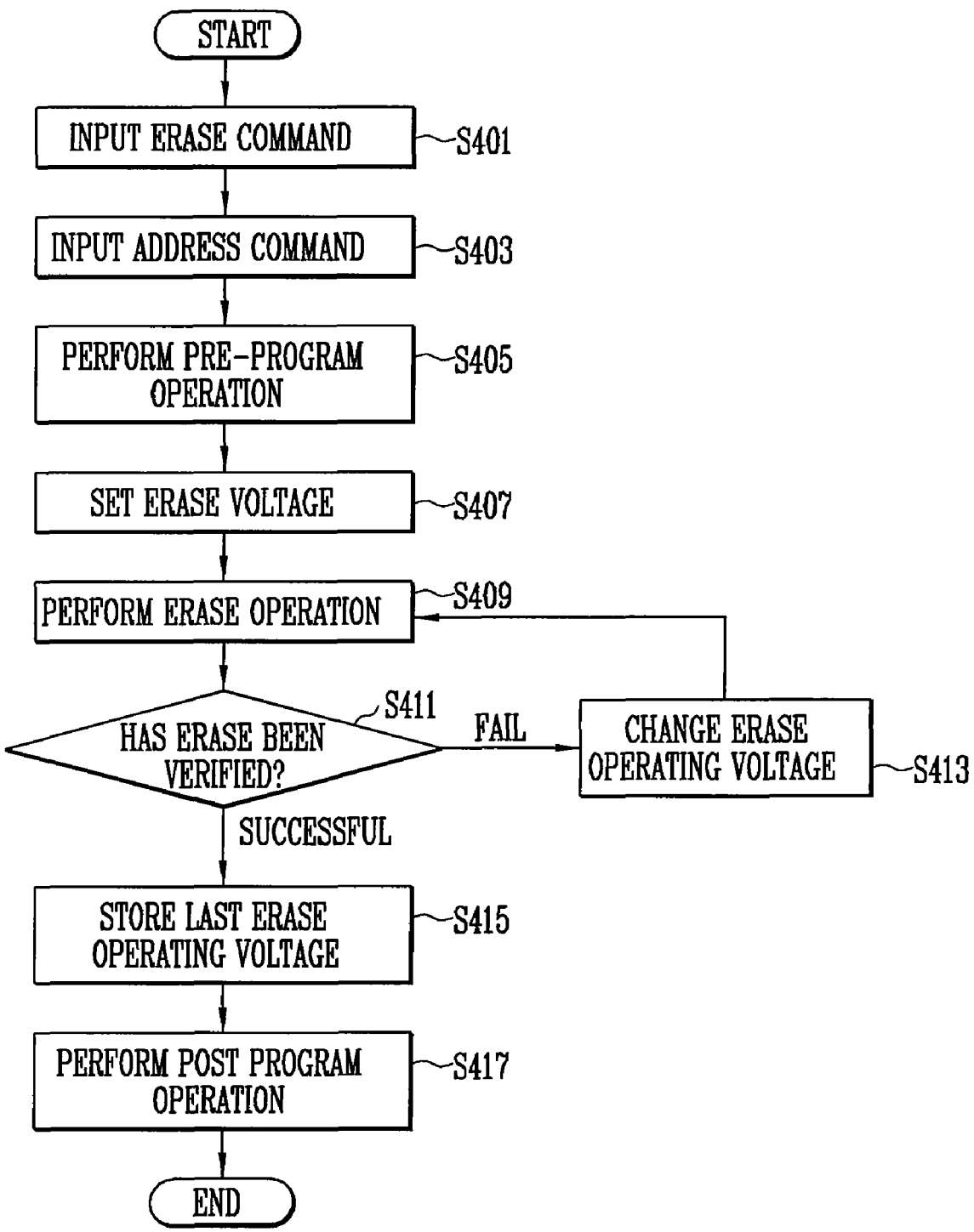
FIG. 4 is a flowchart illustrating an erase method of the flash memory device according to an embodiment of the present invention.

FIG. 4 is a flowchart illustrating an erase method of the flash memory device according to an embodiment of the present invention.

Referring to FIG. 4, in the case where an erase operation is performed, an erase command is input in step S401. An address signal for specifying a target erase block is then input in step S403.

There exist memory cells in a programmed state and memory cells in an erased state in one of a plurality of blocks, which is selected by the address signal. The memory cells of the erase state can include memory cells on which the program operation has not been performed, and memory cells with a fast erase rate. In general, these memory cells have a threshold voltage lower than that of the remaining memory cells. Due to this, threshold voltages of the memory cells of the erased state can have a wide threshold distribution.

In order to narrow the threshold voltage distribution, a pre-program operation is performed in step S405. The pre-program operation can be performed by applying a program voltage lower than a voltage applied in a general program operation. The pre-program operation can be omitted, if appropriate.

The levels of erase operation voltages necessary for the erase operation (e.g., the word line bias and the well bias) are set in step S407. This is for the purpose of controlling a voltage difference between the word line and the well region at the time of the first erase operation using the ISPE method or the DSPE method. In the conventional method the word line bias and the well bias have a constant level and are applied so that the voltage difference between the word line and the well region becomes a predetermined level (e.g., 15V) at the initial stage of the erase operation. In the present invention, however, the level of the word line bias or the well bias is set such that the voltage difference between the word line and the well region can vary depending on the erase rate of memory cells at the initial stage of the erase operation. A method of setting the levels of the biases will be described in detail in a subsequent erase operation voltage storage step (step S415).

If the levels of the erase operating voltages are set, the erase operation is performed on a block selected according to the address signal in step S409. After the erase operation is completed, it is determined whether memory cells included in the selected block are normally erased in step S411. If, as a result of the determination in step S411, there are memory cells that are not normally erased, the erase operation is performed again. Before the erase operation is performed again, the levels of the erase operating voltage, such as the word line bias or the well bias, is changed in step S413.

For example, the level of the well bias can be raised in the case where the erase operation of the ISPE method is performed, or the level of the word line bias can be lowered in the case where the erase operation of the DSPE method is carried out, or the level of the well bias can be raised and the level of the word line bias can be lowered in the case where the erase operation using a mixture of the ISPE method and the DSPE method is performed.

In more detail, in the case where the well bias of 15V is initially applied in the erase operation of the ISPE method, if there exist memory cells on which the erase operation has not been normally performed, the erase operation and the erase verify operation are performed again by raising the initially applied well bias by a predetermined voltage (e.g., 0.5V). The well bias is raised until all the memory cells are erased according to the erase verify results, and can be raised up to 15V to 20V. In this case, the well bias can be raised by a predetermined voltage within a range of 0.1V to 1.5V. Accordingly, the voltage difference between the word line and the well region is increased by as much as the voltage in the well bias is changed (within a range of 0.1V to 1.5V). In this case, the degree of change in the well bias may differ depending on cell size, process characteristics and/or test result values.

In the erase operation of the DSPE method, if there exist memory cells on which the erase operation has not been normally performed, the word line bias that is initially applied is lowered by a predetermined voltage within a range of 0.1V to 1.5V. A variation width of the word line bias may differ depending on cell size, process characteristics and/or test result values. The erase operation and the erase verify operation are performed again by using the lowered word line bias until all the memory cells are erased according to the erase verify results. The word line bias can be lowered up to 5V to 0V. Furthermore, in the case where a negative voltage is used, the word line bias can be lowered down to 0V to −5V, or can be lowered from a positive voltage (e.g., 3V) to a negative voltage (e.g., −3V).

In the erase operation using both the ISPE method and the DSPE method, the well bias is raised while lowering the word line bias by mixing the above methods. The word line bias and the well bias can be controlled at the same time so that an increment of the voltage difference between the word line and the well region can be the same as the voltage difference in the ISPE method or the DSPE method.

As in the above methods, after the level of the erase operating voltage is changed, the erase operation is performed again in step S409. It is then determined whether the erase verify operation has been normally performed on all memory cells in step S411.

If, as a result of the determination in step S411, the erase verify operation has been normally performed on all memory cells, the data values for the final level of the well bias, and the final level of the word line bias, which are applied in the steps S409, S411 and S413, are stored in step S415. The data values corresponding to the levels of the erase operating voltages can be stored by using a Cam cell, a resister, a flip-flop circuit, a capacitor, ROM and a sense amplifier circuit all of which are included in the controller (refer to 370 in FIG. 3) Furthermore, the data value corresponding to the level of the erase operating voltages can be stored by using a memory cell, a flag cell and a spare cell included in the memory cell array. The levels of the erase operating voltages can be stored using an AD converter. In this case, though not illustrated in the drawings, an AD converter for changing the level of the erase operating voltage to a data value can be additionally included. Furthermore, the number of erase operation steps (S409) and erase verify steps (S411) executed can be counted, and can be stored as a data value corresponding to the level of the erase operating voltage.

The levels of the erase operating voltages stored in the above become the level of an erase operating voltage that is initially applied in a new erase operation that is performed in the ISPE method, the DSPE method or a mixture of both. That is, even in the erase voltage setting step (S407), the level of a first erase operation voltage is set according to the levels of the erase operating voltages stored in any one of the means.

In the case where the level of the erase operating voltage is stored on a memory-cell-block basis, the controller (refer to 370 in FIG. 3) controls the high voltage generator (refer to 330 in FIG. 3) and the well bias generator 360 to apply an erase operation voltage of a level, which is stored in a corresponding memory cell block in response to the address signal.

In the memory cell array there may be a memory cell having the fastest erase rate and a memory cell having the slowest erase rate. In this case, as a difference in the threshold voltage between a memory cell having the fastest erase rate and a memory cell having the slowest erase rate increases, threshold voltage distributions can be widened. Therefore, in order to narrow the threshold voltage distributions, a post program operation can be performed in step S417. If the post program operation is performed, the threshold voltage of the memory cell having the fastest erase rate rises faster than the threshold voltage of the memory cell having the slowest erase rate. Accordingly, the threshold voltage distributions of the memory cells can be narrowed.

Meanwhile, it has been described above that the step (S415) of storing the erase operation voltage is performed anterior to the step (S417) of performing the post program operation. However, it is to be noted that the step (S415) of storing the erase operation voltage can be performed posterior to the step (S417) of performing the post program operation.

Though not illustrated in the drawings, in the case where another memory cell block is erased, another address signal is input, and the steps S401 to S417 are performed again.

The erase method described above according to an embodiment of the present invention is described in detail below. The erase operation does not always begin at a constant erase operation voltage, but starts at an erase operation voltage through which all the memory cells are normally erased in the previous erase operation. Therefore, if all the memory cells are normally erased when the well bias uses a range from 15V to 20V on a 1V basis and the well bias of 17V is applied in a previous erase operation, the well bias of 17V is initially applied in a subsequent erase operation and uses a range from 17V to 20V. Thus, since a change in the well bias is reduced, an erase operating time can be shortened. Accordingly, the same advantages can be obtained even in the erase operation of the DSPE method or the erase operation using a mixture of the ISPE method and the DSPE method in which the word line bias is changed.

Furthermore, since the range of change in the erase operation voltage can be reduced, a width in the change of the erase operation voltage can also be reduced. That is, the well bias that has been changed by 1V can be changed by 0.5V, so that less stress will be exerted on the memory cells. For example, if the memory cells can be erased by applying the well bias of 17.2V, an excess of 0.8V would be applied to the memory cells to erase them if the erase voltage is incremented by 1V. However, the excess voltage applied would be 0.3V if the erase voltage is incremented by 0.5V. This would reduce the stress applied to the memory cells.

It is to be noted that the voltage conditions presented as an example above may be changed depending on the size of a memory cell, the types of layers constituting a memory cell, and/or a high voltage level generated therein.

In particular, it has been described above that data corresponding to the level of the lowest word line bias or the highest well bias, which is applied in the erase operation, is stored on a block basis. However, the data can be stored on a plane basis including a plurality of blocks.

In more detail, data corresponding to the level of the highest well bias or the lowest word line bias, of the erase operations of all blocks included in the plane, is stored to represent the entire plane. In this case, data is stored for every plane. Furthermore, the data can be stored on a chip basis. Further, data corresponding to the level of the highest well bias or the lowest word line bias, of the erase operations of all blocks included in the chip, can be stored to represent the entire chip. In this case, one data can be stored for every chip. The level of the word line bias or the well bias, which is initially applied in the erase operation, is decided in the same manner as every block included in a plane or chip according to stored data.

As described above, according to the present invention, an erase operation of the ISPE method or the DSPE method is performed in parallel to an erase verify operation while gradually increasing a voltage difference between the control gate and the well region, a voltage difference between the control gate and the well region when all memory cells are normally erased is stored, and an erase operation of the ISPE method or the DSPE method is performed by setting the stored voltage difference as a first voltage difference of a subsequent erase operation. Accordingly, an erase characteristic (E/W cycling characteristic) of a memory cell can be improved while shortening an erase operating time.

Figure 1:
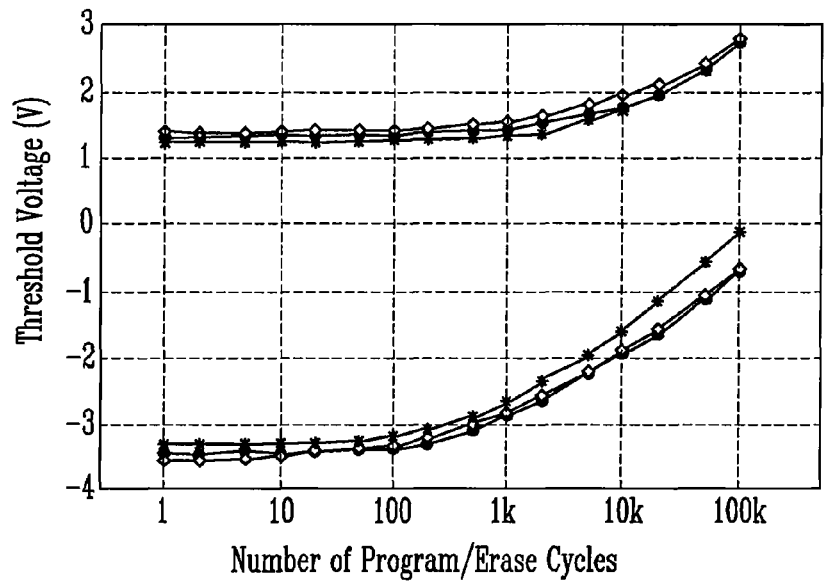
FIG. 1 is a graph illustrating variation in threshold voltages depending on the number of a program operation and an erase operating that are repeatedly performed.
Figure 2:
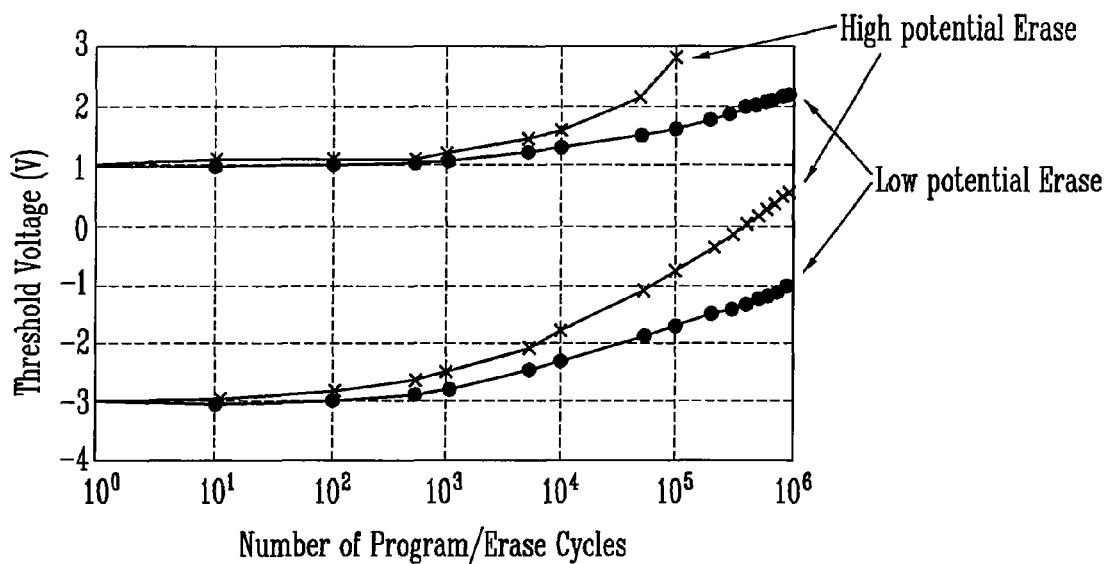
FIG. 2 is a graph illustrating variation in a fast program phenomenon and a slow erase phenomenon depending on erase voltages.

In particular, an erase characteristic of a memory cell having a slow erase rate can be improved, and a program characteristic of a memory cell having a fast program rate can be improved accordingly. In other words, when the erase operation and the program operation are repeatedly performed several thousand times in FIG. 1, the erase rate becomes slow. In this case, a phenomenon in which a threshold voltage becomes higher than a target voltage after the program operation can be minimized. This higher target voltage is caused by electrons being trapped in the oxide layer, which causes the program rate to be higher than normal.

Although the foregoing description has been made with reference to the specific embodiments, it is to be understood that changes and modifications of the present patent may be made by the ordinary skilled in the art without departing from the spirit and scope of the present patent and appended claims.

What is claimed is:

1. An erase method of a flash memory device, the method comprising:

performing a plurality of first erasures to complete a first erase operation to erase a first memory cell block, wherein an erase voltage is changed after each first erasure that does not erase all memory cells in the first memory cell block;

storing information on a first erase voltage used for one of the first erasures that successfully erased the first memory cell block during the first erase operation; and performing a plurality of second erasures to complete a second erase operation to erase a second memory cell block using a second erase voltage that is initially equal to the stored first erase voltage, wherein the second erase voltage is changed after each second erasure that does not erase all memory cells in the second memory cell block, the second erase operation being performed after the first erase operation.

2. The erase method of claim 1, wherein the first erase operation and the second erase operation use an Incremental Stepping Pulse Erase (ISPE) method that increases the erase voltage after each erasure that does not successfully perform the erase operation.

3. The erase method of claim 2, wherein the first erase voltage and the second erase voltage are voltages applied to a well region of the memory cell block.

4. The erase method of claim 3, wherein the erase voltage is changed within the range of 15V to 20V according to the ISPE method.

5. The erase method of claim 4, wherein the erase voltage is changed by an amount of 0.1V to 1.5V after each erasure that does not successfully erase the memory cell block.

6. The erase method of claim 1, wherein the first erase operation and the second erase operation use a Decreasing Stepping Pulse Erase (DSPE) method that decreases the erase voltage after each erasure that does not successfully perform the erase operation.

7. The erase method of claim 6, wherein the first erase voltage and the second erase voltage are voltages applied to word lines associated with the selected memory cell block.

8. The erase method of claim 7, wherein the erase voltage is changed by a given voltage amount after each erasure that does not successfully erase the memory cell block, the given voltage amount being in the range of 5V to 0V, 0V to −5V, or 3V to −3V.

9. The erase method of claim 7, wherein the erase voltage is changed by an amount of 0.1V to 1.5V after each erasure that does not successfully erase the memory cell block.

10. The erase method of claim 1, wherein the first erase operation and the second erase operation are performed while changing the first erase voltage and the second erase voltage, so that a voltage difference between a word line and a well region is increased.

11. The erase method of claim 10, wherein the first erase voltage and the second erase voltage are changed by decreasing a bias applied to the word line and raising a bias applied to the well region.

12. The erase method of claim 10, wherein the voltage difference between the word line and the well region is changed in a voltage amount of 0.1V to 1.5V.

13. The erase method of claim 1, wherein the first erase operation or the second erase operation includes:

inputting an erase command signal for erasing the memory cell block;

inputting an address signal for selecting the memory cell block;

setting an erase voltage using the information stored on an erase voltage that was used for a previous erase operation that has been successfully completed;

applying the erase voltage from the setting step to lower a threshold voltage of the memory cells;

detecting the threshold voltage of the memory cell; and changing the erase voltage applied according to a result of the detection of the threshold voltage, wherein the threshold voltage of the memory cell is lowered by changing the erase voltage applied until the memory cell block is erased successfully according to the result of the detection of the threshold voltage.

14. The erase method of claim 13, wherein the erase voltage applied is changed so that a voltage difference between a word line associated with the memory cell block and a well region of the memory cell block is increased.

15. The erase method of claim 14, further comprising performing a pre-program operation of the memory cell block before the setting step.

16. The erase method of claim 14, further comprising performing a post program operation of the memory cell block after the memory cell block has been erased.

* * * * *